US012696403B2

(12) United States Patent
Deng et al.

(10) Patent No.:  US 12,696,403 B2
(45) Date of Patent:       Jul. 28, 2026

(54) DISPLAY PANEL AND DISPLAY DEVICE HAVING FLEXIBLE PRINTED CIRCUIT BOARD

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Tianjun Deng, Beijing (CN); Rongkun Fan, Beijing (CN); Weiben Zhang, Beijing (CN); Qiang Gou, Beijing (CN); Tao Su, Beijing (CN); Yuan Liu, Beijing (CN); Jianhua Shu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 118 days.

(21) Appl. No.: 18/697,372

(22) PCT Filed: Jul. 6, 2023

(86) PCT No.: PCT/CN2023/106118
§ 371 (c)(1),
(2) Date: Mar. 29, 2024

(87) PCT Pub. No.: WO2024/022077
PCT Pub. Date: Feb. 1, 2024

(65) Prior Publication Data
US 2024/0414856 A1      Dec. 12, 2024

(30) Foreign Application Priority Data
Jul. 25, 2022    (CN) ........................ 202210884326.X

(51) Int. Cl.
*H05K 5/02*              (2006.01)

(52) U.S. Cl.
CPC ...................................... *H05K 5/02* (2013.01)

(58) Field of Classification Search
CPC ........... H05K 5/02; H05K 2201/10128; H05K 1/189; H05K 3/361; H05K 1/118; G09F 9/30
See application file for complete search history.

(56) References Cited

U.S. PATENT DOCUMENTS

2016/0172623 A1*  6/2016  Lee ........................... B32B 3/04
                                                         257/40
2016/0181345 A1*  6/2016  Lee ........................ H05K 1/028
                                                         257/40
(Continued)

FOREIGN PATENT DOCUMENTS

CN            108008584 A       5/2018
CN            108241240 A       7/2018
(Continued)

*Primary Examiner* — David D Davis
(74) *Attorney, Agent, or Firm* — WHDA, LLP

(57)                    ABSTRACT

A display panel is provided. The display panel includes a display substrate and a flexible printed circuit board; the display substrate includes a display area, a binding area, and a bending area located between the display area and the binding area, the bending area is bent so that the binding area is located on a backlight side of the display area, and a support structure is provided between the displaying area and the binding area when the bending area is in a bending state; the flexible printed circuit board includes a main body part, a binding part for binding connection with the binding area, and a bending part located between the main body part and the binding part.

15 Claims, 5 Drawing Sheets

(56)  References Cited

U.S. PATENT DOCUMENTS

| | | | | |
|---|---|---|---|---|
| 2019/0207130 A1* | 7/2019 | He | ........................ | H10K 77/111 |
| 2020/0310577 A1* | 10/2020 | Jeon | .................... | H04M 1/0266 |
| 2021/0011566 A1* | 1/2021 | Bai | ........................ | G06F 1/1643 |
| 2021/0157431 A1* | 5/2021 | Gu | ........................ | G06F 1/1652 |
| 2021/0343824 A1* | 11/2021 | Kim | ...................... | G02F 1/1345 |
| 2022/0288886 A1* | 9/2022 | Li | .......................... | B32B 15/06 |

FOREIGN PATENT DOCUMENTS

| | | | |
|---|---|---|---|
| CN | 109240013 | A | 1/2019 |
| CN | 208488922 | U | 2/2019 |
| CN | 111292622 | A | 6/2020 |
| CN | 111864115 | A | 10/2020 |
| CN | 113133201 | A | 7/2021 |
| CN | 114038892 | A | 2/2022 |
| CN | 114220344 | A | 3/2022 |
| CN | 115083291 | A | 9/2022 |
| CN | 116072012 | A | 5/2023 |
| CN | 116264048 | A | 6/2023 |
| JP | 2002-107751 | A | 4/2002 |
| TW | 1651703 | B | 2/2019 |

* cited by examiner

DISPLAY PANEL AND DISPLAY DEVICE HAVING FLEXIBLE PRINTED CIRCUIT BOARD

CROSS-REFERENCE TO RELATED APPLICATION

The present application is the U.S. national phase of PCT Application PCT/CN2023/106118 filed on Jul. 6, 2023, which claims a priority to the Chinese patent application No. 202210884326.X filed in China on Jul. 25, 2022, which is incorporated herein by reference in its entirety.

TECHNICAL FIELD

The present disclosure relates to the field of display product manufacturing, in particular to a display device.

BACKGROUND

With the development of the market, functions of mobile phone become more and more powerful, and the problem of battery endurance comes along. In order to increase the battery space and capacity, a main FPC is bent outward again from the inside of the product display area, for providing more space for the whole battery assembly and improving the battery endurance. However, there are following problems:

1. The bending start point of the FPC cannot be guaranteed, and a display substrate is easily pulled during the bending process, resulting in product damage and poor quality.
2. After the bending of the FPC is completed, bending area of the FPC is warped, and the pulling stress continuously acts on the binding area of the display panel, resulting in separation of the FPC from the display substrate and poor lighting.

SUMMARY

In order to solve the above-mentioned technical problems, the present disclosure provides a display panel and a display device, which solve the problems that, when the flexible printed circuit board is in secondary bending, the bending start point cannot be guaranteed, and the FPC is easily separated from the display substrate after the bending.

In order to achieve the above object, the embodiments of the present disclosure adopt the following technical solutions: a display panel including a display substrate and a flexible printed circuit board;

the display substrate includes a display area, a binding area, and a bending area located between the display area and the binding area, where the bending area is bent so that the binding area is located on a backlight side of the display area, and a support structure is provided between the displaying area and the binding area when the bending area is in a bending state;

the flexible printed circuit board includes a main body part, a binding part for binding connection with the binding area, and a bending part located between the main body part and the binding part, where when the bending part is in a bending state, the bending part bends so that the main body part is bent to a side of the binding area away from the display area;

where the bending part includes a first part located between the bending starting point and the binding part, and a support layer is provided between the first part and the support structure.

Optionally, a first surface of the support layer away from the display area is flush with a second surface of the binding area away from the display area.

Optionally, a first back film layer is provided between the binding area and the support structure, the first back film layer is connected to the support structure through an adhesive layer, and the support layer is provided on a same layer as the adhesive layer.

Optionally, a first back film layer is provided between the binding area and the support structure, the first back film layer is connected to the support structure through an adhesive layer, and the support layer covers a side of the adhesive layer away from the support structure.

Optionally, the support layer and the adhesive layer are integrative structure, or the support layer and the adhesive layer are separated structure.

Optionally, a gap is provided between the support layer and the binding area in a first direction, the first direction is a direction from the bending start point to the binding area, and the first direction is parallel to the display area.

Optionally, the gap is greater than or equal to 1.1 mm.

Optionally, a side edge of the support layer near the bending part is flush with the bending start point in a first direction, the first direction is a direction from the bending start point to the binding part, and the first direction is parallel to the display area.

Optionally, a width of the support layer is greater than or equal to 1.1 mm in a first direction, the first direction is a direction from the bending start point to the binding area, and the first direction is parallel to the display area.

Optionally, the bending part includes an arc-shaped part, the first part and a second part which are located on opposite sides of the arc-shaped part, a support adhesive layer is provided between the first part and second part, where a side edge of the support adhesive layer facing the arc-shaped part is flush with the bending start point of the bending part, and the side edge of the support adhesive layer facing the arc-shaped part is flush with a bending end point of the bending part.

Optionally, an orthographic projection of the support adhesive layer on the display area overlaps at least partially with an orthographic projection of the support layer on the display area.

Optionally, a protective adhesive layer is provided between the side of the binding area near the support layer and the flexible printed circuit board.

Optionally, a driver IC (Integrated Circuit) is provided at the side of the binding area away from the display area, and a connection adhesive layer is provided between the main body part of the flexible printed circuit board and the binding area, where the connection adhesive layer is coated on outside of the driver IC.

Optionally, a distance between the driver IC and the main body part is greater than 0.2 mm in a second direction, where the second direction is parallel to a light exiting direction of the display substrate.

The embodiments of the present disclosure further provide a display device including the display panel described above.

The beneficial effects of the present disclosure are described as follows. A support layer is provided to determine a bending start point for bending of the flexible printed circuit board, so as to avoid the problem of damage to the display substrate caused by pulling the display substrate during bending; and the support layer functions as avoiding the warping of the bending part of the flexible printed circuit board, thereby avoiding the separation of the flexible printed circuit board and the display substrate and ensuring the quality of the display product.

DETAILED DESCRIPTION

Figure 1:
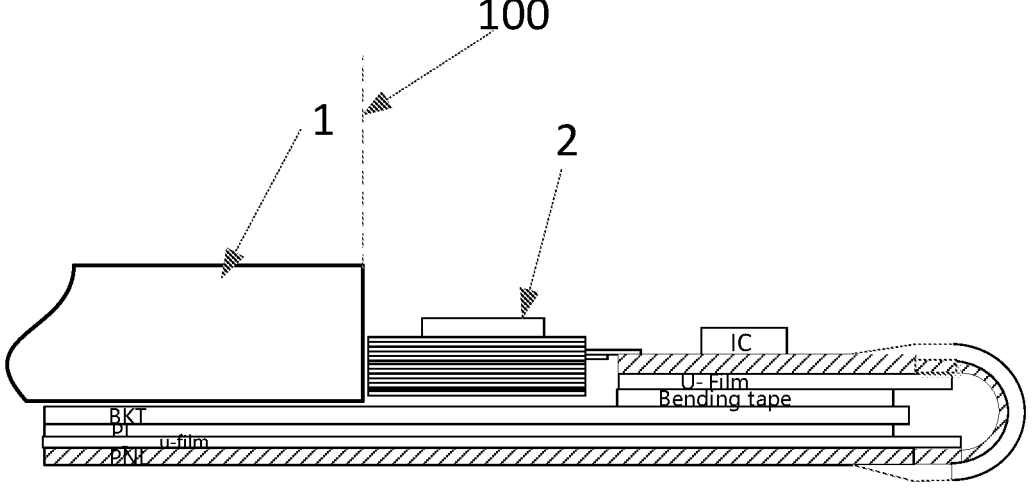
FIG. 1 shows a first schematic diagram of a display panel in the related art.

In order to make objective, technical solutions, and benefits of the embodiments of the present disclosure clearer, the technical solutions in the embodiments of the present disclosure will be described clearly and completely with reference to the accompanying drawings. Obviously, the embodiments described are only some, but not all, of the embodiments of the present disclosure. Based on the described embodiments of the present disclosure, all other embodiments obtained by those of ordinary skill in the art fall within the protection scope of the present disclosure.

In the description of the present disclosure, it is to be appreciated that orientations or positional relationships indicated by terms such as "up", "down", "left", "right", "inside" and "outside" are based on the orientations or positional relationships shown in the drawings to facilitate and simplify the description of the present disclosure, not to indicate or imply that the means or elements involved should have specific orientations, or be constructed and operated with specific orientations, and therefore should not be construed as limiting of the present disclosure. In addition, the terms "first", "second", and "third" are used for descriptive purposes only and should not be construed as indicating or implying relative importance.

Figure 2:
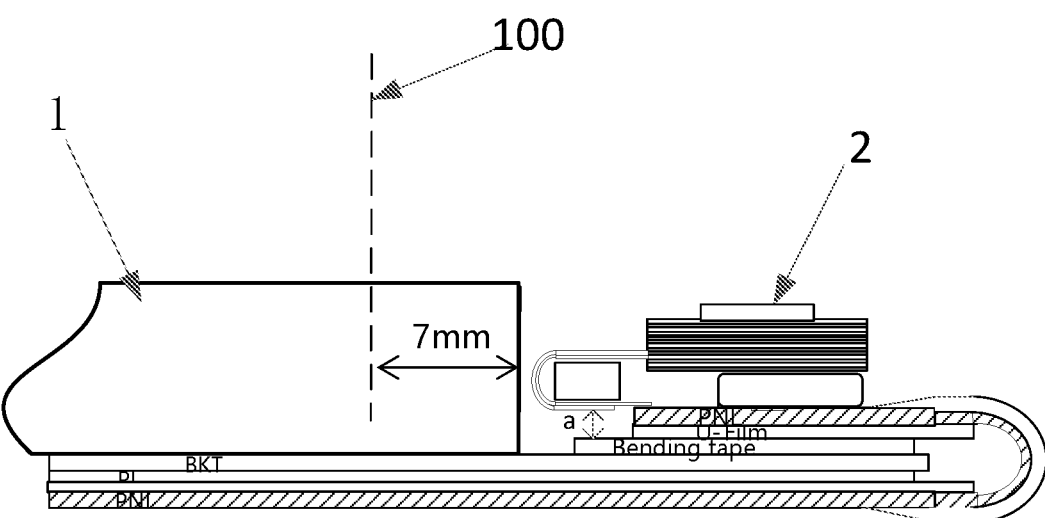
FIG. 2 shows a second schematic diagram of a display panel in the related art.

FIG. 1 is a schematic diagram of the flexible printed circuit board without secondary bending in the related art, and FIG. 2 is the schematic diagram of the flexible printed circuit board with secondary bending in the related art. The flexible printed circuit board 2 is bound to the binding area of the display substrate, the display substrate is bent, the flexible printed circuit board 2 is bent to the backlight side of the display substrate along with the binding area, and the flexible printed circuit board 2 is bent again to provide more space for the battery 1. Comparing FIG. 1 and FIG. 2, it can be evidently obtained that the flexible printed circuit board 2 is in secondary bending, for providing more space for the assembly of the whole machine battery 1 and improving the battery endurance. For example, the dotted line 100 in FIG. 1 and FIG. 2 both indicate the position of battery 1 in FIG. 1 near the side of the flexible printed circuit board 2, and after secondary bending of the flexible printed circuit board 2, the width of the flexible printed circuit board 2 parallel to the battery 1 increases by 7 mm, and the capacity is estimated to increase by 300 mAh (which is not limited).

Figure 3:
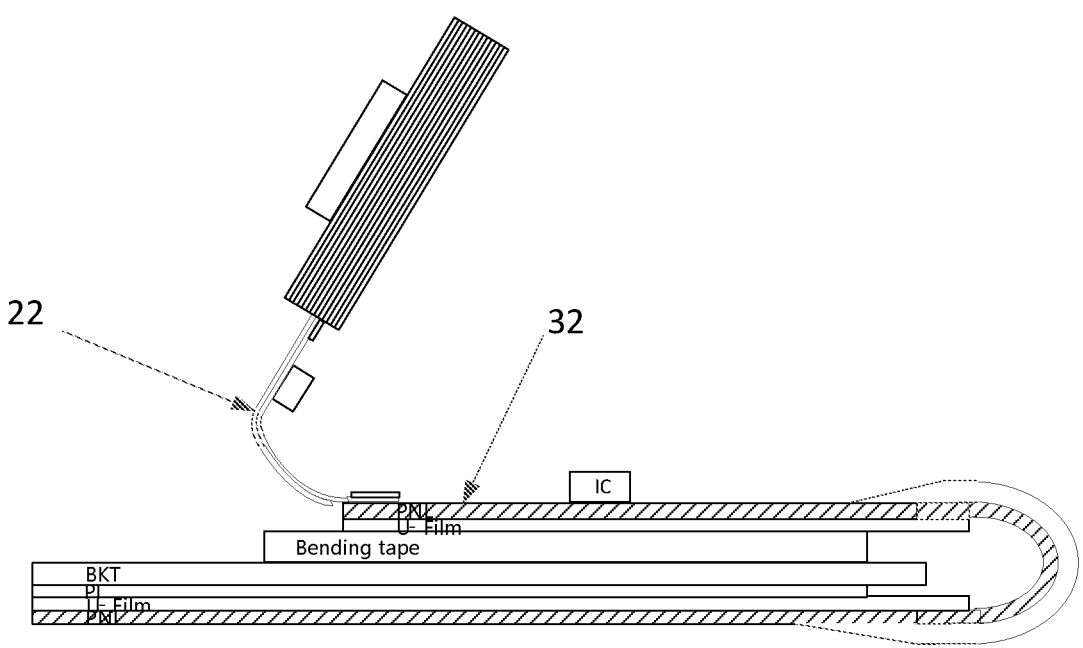
FIG. 3 shows a third schematic diagram of a display panel in the related art.

FIG. 3 is a schematic diagram of the flexible printed circuit board in the bending process, the bending start point cannot be guaranteed, and it is easy to pull the display substrate during the bending process, resulting in product damage and defects. After the flexible printed circuit board is bent, the bending area is warped, the bending part (especially the bending area) of the flexible printed circuit board is suspended in the air, and the bending area is prone to warping, which cause pulling force on the binding area 32 of the display substrate, leading to the separation of the display substrate and the flexible printed circuit board.

Referring to FIG. 4 to FIG. 13, in order to solve the above-mentioned technical problem, the embodiment provides a display panel, including a display substrate 3 and a flexible printed circuit board 2.

The display substrate 3 includes a display area 31, a binding area 32, and a bending area 33 located between the display area 31 and the binding area 32. The bending area 33 is bent so that the binding area 32 is located on the backlight side of the display area 31, and when the bending area 33 is in a bending state, a support structure 8 is provided between the display area 31 and the binding area 32.

The flexible printed circuit board 2 includes a main body part 21 and a binding part 23 for binding connection with the binding area 32, and a bending part 22 located between the main body part 21 and the binding part 23, and when the bending part 33 is in a bending state, the bending part 22 bends so that the main body part 21 is bent to the side of the binding area 32 away from the display area 31.

The bending part 22 includes a first part 202 located between the bending start point and the binding part 23, and a support layer 4 is provided between the first part 202 and the support structure 8.

The support layer 4 is provided to determine the bending start point for bending of the flexible printed circuit board 2, which is conducive to the formation of the bending morphology of the bending part 22, avoiding the problem of damage to the display substrate 3 caused by pulling the display substrate 3 during bending. Meanwhile, the support layer 4 functions as supporting and fixing the bending part 22, which can avoid the warping of the bending part 22 of the flexible printed circuit board 2, so as to avoid the separation of the flexible printed circuit board 2 and the display substrate 3 and guarantee the quality of the display product.

In exemplary embodiments, the first surface of the support layer 4 away from the display area 31 is flush with the second surface of the binding area 32 away from the display area 31.

Adopting the above scheme, the flatness of the first part 202 and the binding part 23 can be guaranteed, which in turn reduces the pulling force on the binding area 32 of the display substrate 3.

It should be noted that, in the bending state, if a protective adhesive layer is provided on the side of the bending part 22 away from the main body part 21, the first surface of the support layer 4 away from the display area 31 is not flush with the second surface of the binding area 32 away from the display area 31, the relative position between the first surface of the support layer 4 away from the display area 31 and the second surface of the binding area 32 away from the display area 31 is set according to actual needs, so as to avoid that the first part 202 and the binding part 23 have a height difference in the direction perpendicular to the display area 31 (referring to the Y direction in FIG. 4), thereby avoiding pulling on the binding area 32 of the display substrate.

Illustratively, in a direction parallel to the light exiting direction of the display substrate 3 (referring to the Y direction in FIG. 4), the thickness of the support layer 4 is a sum of the thickness of the first back film layer 9 and the binding area 32, which, for example, may be 100 μm, but is not limited thereto.

Figure 15:
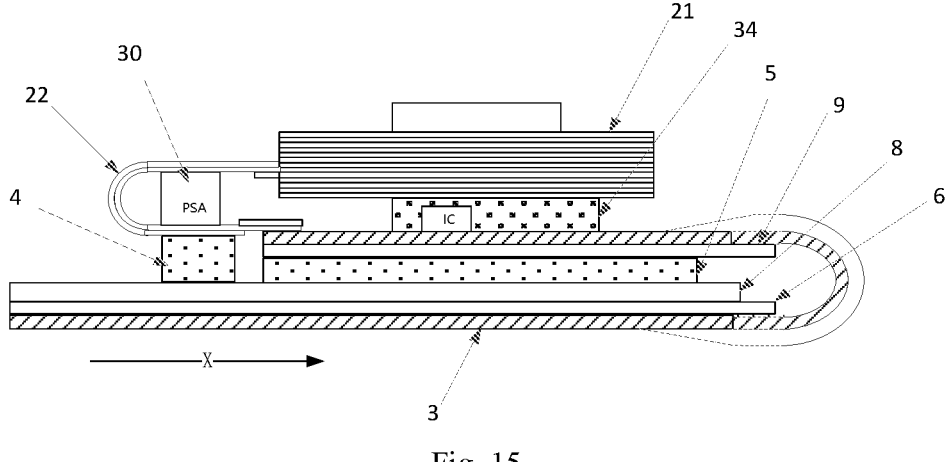
FIG. 15 shows a second schematic diagram of the display panel in the embodiment of the present disclosure.

In the exemplary embodiment, a first back film layer 9 is provided between the binding area 32 and the support structure 8, the first back film layer 9 is connected with the support structure 8 through an adhesive layer 5, and the support layer 4 is provided on the same layer as the adhesive layer 5, with reference to FIG. 15.

Figure 4:
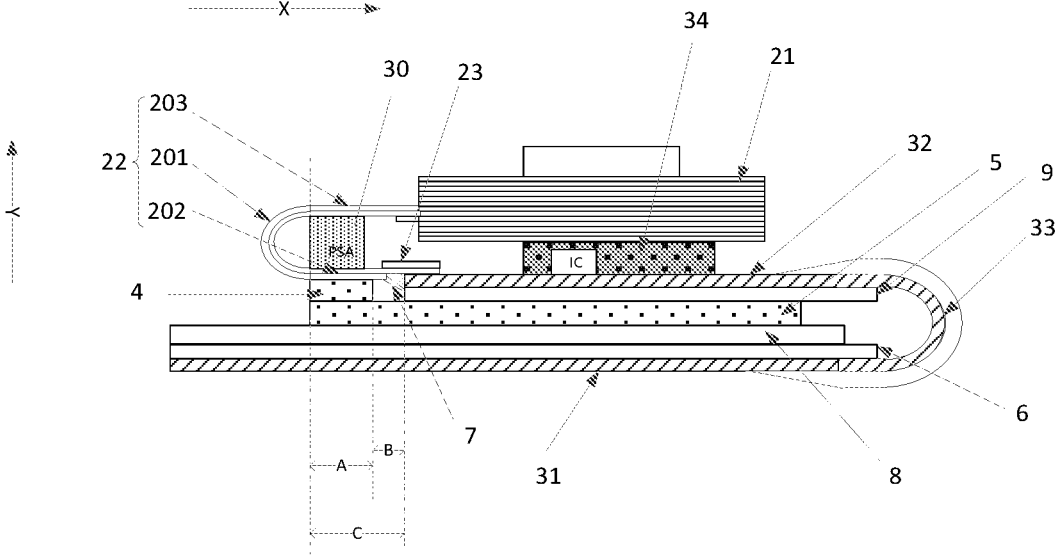
FIG. 4 shows a first schematic diagram of a display panel in an embodiment of the present disclosure.

In the exemplary embodiment, a first back film layer 9 is provided between the binding area 32 and the support structure 8, the first back film layer 9 is connected with the support structure 8 through an adhesive layer 5, and the support layer 4 is provided to cover a side of the adhesive layer 5 away from the support structure 8, with reference to FIG. 4.

In exemplary embodiments, the support layer 4 and the adhesive layer 5 are integrative structure, or the support layer 4 and the adhesive layer 5 are separated structure.

Figure 5:
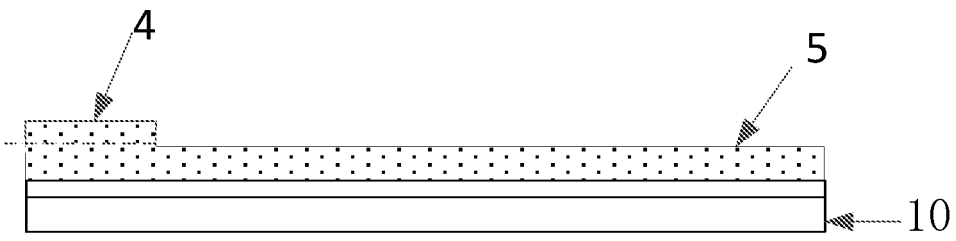
FIG. 5 shows a schematic diagram of a support layer and an adhesive layer attaching to a base film in an embodiment of the present disclosure.
Figure 6:
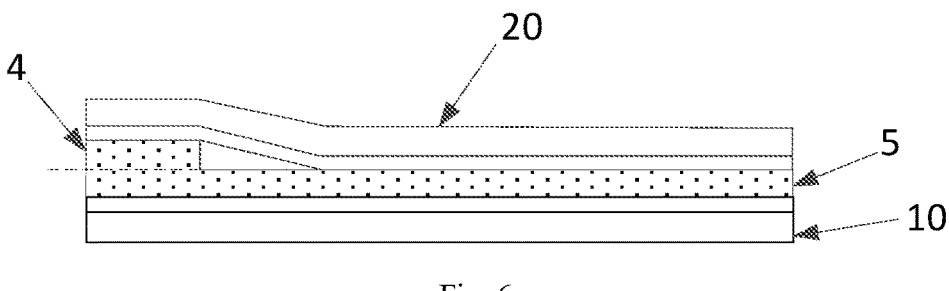
FIG. 6 shows a first schematic diagram after a release film is attached to the support layer and the adhesive layer.

Referring to FIG. 5 and FIG. 6, illustratively, in the manufacturing process of the first back film layer 9 and support layer 4, the following steps are included:

providing a base film 10;

disposing a first adhesive layer (such as double-sided tape) on the base film 10;

attaching the first back film layer 9 and the support layer 4, which are the integrative structure, on a side of the first adhesive layer away from the base film 10;

disposing a second adhesive layer (such as double-sided tape) on a side of the first back film layer 9 and the support layer 4 away from the base film 10;

disposing a release film 20 on a side of the second adhesive layer away from the base film 10.

The dashed line in FIG. 5 and FIG. 6 is a kind of dividing line between the support layer 4 and the adhesive layer 5, but is not limited thereto. For example, the dividing line may be perpendicular to the direction of the adhesive layer 5

Illustratively, in the manufacturing process of a first back film layer 9 and a support layer 4, the following steps are included:

providing a base film 10;

disposing a first adhesive layer (such as double-sided tape) on the base film 10;

attaching a first back film layer 9 and the support layer 4, which are the separated structure, on a side away from the base film 10 of the first adhesive layer;

disposing a second adhesive layer (such as double-sided tape) on a side away from the base film 10 of the first back film layer 9 and the support layer 4;

disposing a release film 20 on a side of the second adhesive layer away from the base film 10.

It should be noted that the first back film layer 9 and the support layer 4, which are the integrative structure, indicate that the first back film layer 9 and the support layer 4 are integrally formed, and can be completed through a single attaching process when attaching. The first back film layer 9 and the support layer 4, which are separated structure, indicate that the first back film layer 9 and the support layer 4 are independent, and need to be attached sequentially when attaching, that is, they need to be attached through twice attaching processes.

Figure 7:
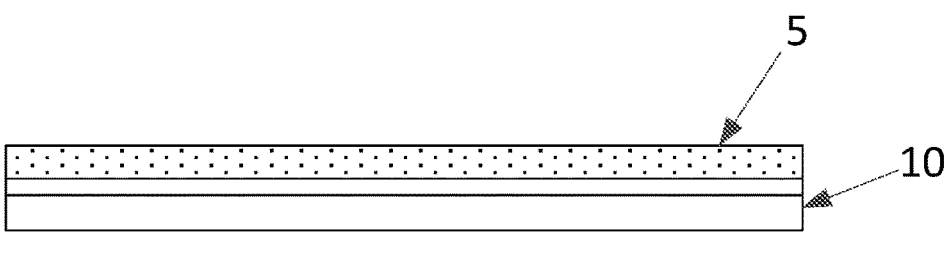
FIG. 7 shows a schematic diagram of attaching the adhesive layer to the base film.
Figure 8:
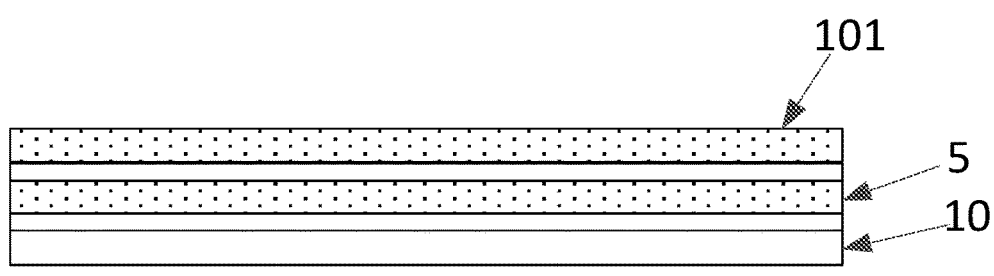
FIG. 8 shows a schematic diagram of attaching a preset adhesive layer to the adhesive layer.
Figure 9:
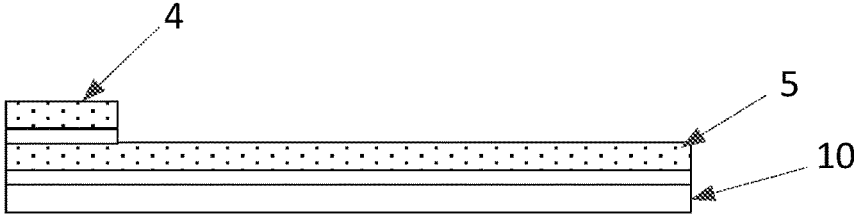
FIG. 9 shows a schematic diagram after the formation of the support layer.
Figure 10:
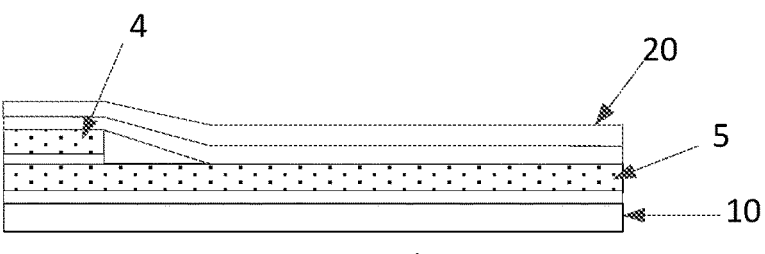
FIG. 10 shows a second schematic diagram after a release film is attached to the support layer and the adhesive layer.

Referring to FIG. 7 and FIG. 10, illustratively, in the manufacturing process of a first back film layer 9 and a support layer 4, the following steps are included: providing a base film 10;

disposing a first adhesive layer (such as double-sided tape) on the base film 10;

attaching a first back film layer 9 on a side of the first adhesive layer away from the base film 10;

attaching a second adhesive layer (such as double-sided tape) on a side of the first back film layer 9 away from the base film 10;

attaching a base film layer 101 on a side of the second adhesive layer away from the first back film layer 9;

forming a support layer 4 through exposing and apparently processing the base film layer 101;

disposing a third adhesive layer (such as double-sided tape) on a side of the first back film layer 9 and the support layer 4 away from the base film 10;

disposing a release film 20 on a side of the third adhesive layer away from the base film 10.

It should be noted that the materials of the first back film layer 9 and the support layer 4 may be the same or different. In exemplary embodiments, the first back film layer 9 and the support layer 4 are made of the same material. For example, the first back film layer 9 and the support layer 4 may be made of PET (polyethylene terephthalate), but are not limited thereto.

It should be noted that, when manufacturing a display panel, the first back film layer 9 and the support layer 4 can be prepared separately and then attached to the support structure 8 of the display panel, or the first back film layer 9 and the support layer 4 can also be directly formed on the support structure 8.

Figure 11:
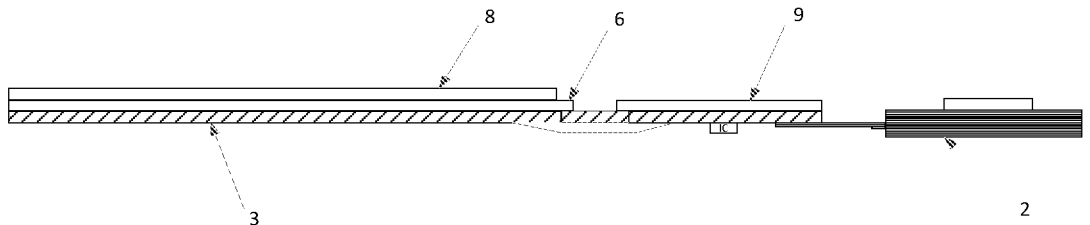
FIG. 11 shows a schematic diagram that an bending area of the display panel is in the unfolded state.
Figure 12:
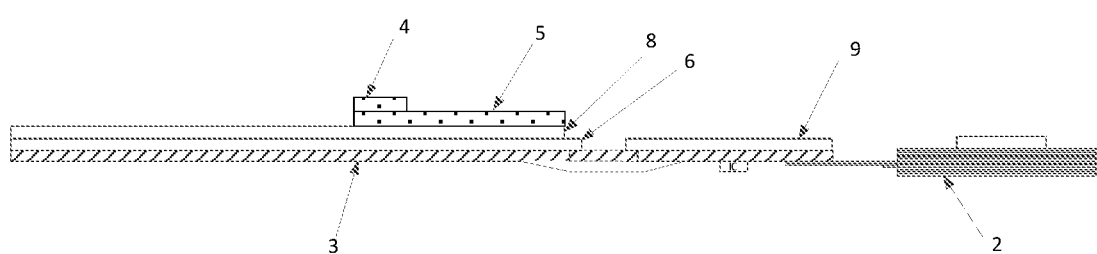
FIG. 12 shows a first schematic diagram of forming the support layer and the adhesive layer on the backlight side of the display area.
Figure 13:
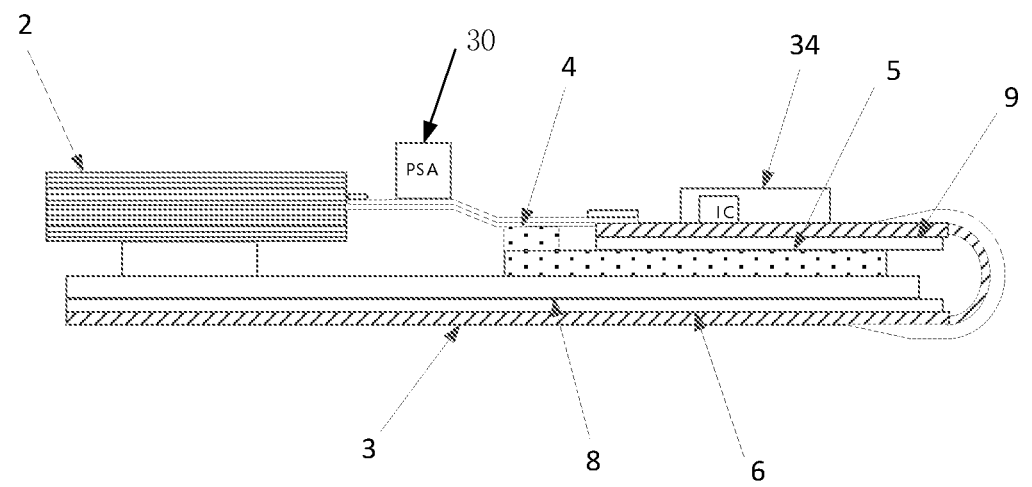
FIG. 13 shows a schematic diagram of a bending area of a display panel in a bending state.

Referring to FIG. 11 to FIG. 13, in an embodiment, the first back film layer 9 and the support layer 4 are independently made as an integrative structure, the base film 10 is removed, the first back film layer 9 and the support layer 4 are attached to the support structure 8. The bending area 33 of the display substrate 3 is bent so that the flexible printed circuit board 2 is bent to the backlight side of the display substrate 3. The release film 20 on the first back film layer 9 and the support layer 4 is removed, so that the first part 202 of the flexible printed circuit board 2 is connected with the support layer 4. The flexible printed circuit board 2 is bent again to the side of the binding area 32 of the display substrate 3 away from the display area 31.

Figure 14:
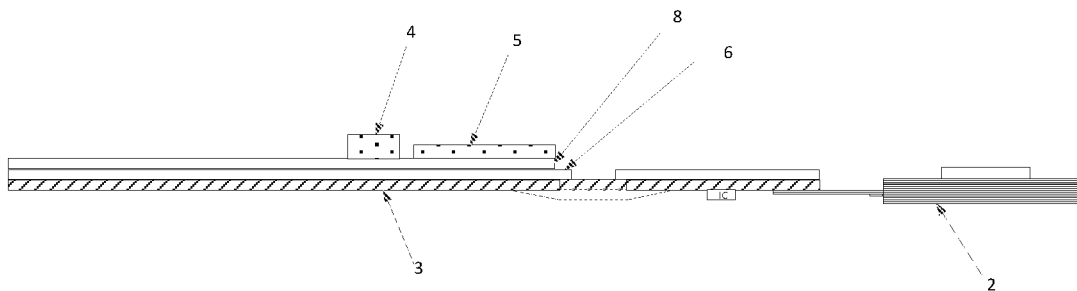
FIG. 14 shows a second schematic diagram of forming the support layer and the adhesive layer on the backlight side of the display area.

Referring to FIGS. 14 and 15, in one embodiment, the first back film layer 9 and the support layer 4 are directly formed on the display substrate 3, for example, following steps are included:

forming a second back film layer 6, display substrate 3, polarizer and cover plate (polarizer and cover plate not shown) on the support structure 8 in sequence;

binding and connecting the display substrate 3 to the flexible printed circuit board 2;

attaching the second back film layer 6 on a side of the support structure 8 away from the display substrate 3;

attaching the support layer 4 on the side of the support structure 8 away from the display substrate 3;

the bending area 33 of the display substrate 3 is bent so that the flexible printed circuit board 2 is bent to the side of the support structure 8 away from the display substrate 3, and the first part 202 of the flexible printed circuit board 2 is connected to the support layer 4;

the bending part 22 of the flexible printed circuit board 2 is bent so that the main body part 21 of the flexible printed circuit board 2 is bent to the side of the binding area 32 away from the display area 31.

In the step of attaching the support layer 4 on the side of the support structure 8 away from the display substrate 3, the support layer 4 can be provided on the same layer as the first back film layer 9, or can cover a side of the first back film layer 9 away from the support structure 8.

In exemplary embodiments, in the first direction (referring to the X direction in FIG. 4 and FIG. 15), there is a gap between the support layer 4 and the binding area 32. The first direction is from the bending starting point to the binding part 23, and the first direction is parallel to the display area 31.

In exemplary embodiments, the gap is greater than or equal to 1.1 mm.

Referring to FIG. 4, during the manufacturing process, in the first direction, the width of the gap between the support layer 4 and the binding area 32 is B=SQRT{(Pad Bending tolerance)^2+ (Pad Cut tolerance)^2+ ((Size tolerance of support structure 8)^2)+ (Fit tolerance of support layer 4)^2+ (Size tolerance of protective adhesive layer 7)^2}+Width of the first back film layer 9=SQRT {0.1^2+0.05^2+0.2^2+ 0.2^2+0.15^2}+0.75=0.35+0.75=1.1 mm.

Where, the Pad Bending tolerance is the bending tolerance of the bending area 33 of the display substrate 3 (in the first direction).

The display substrate 3 generally includes upper and lower borders, left and right borders, and lower borders, the binding area 32 is located on the lower border, and the Pad Cut tolerance is the cutting tolerance for cutting the lower border (in the first direction).

In the first direction, a protective adhesive layer 7 is provided between the flexible printed circuit board 2 and the side of the binding area 32 away from the bending area 33, the protective adhesive layer 7 function as protecting the flexible printed circuit board 2, and the dimensional tolerance of the protective adhesive layer 7 in the first direction is also a determining factor of the width B of the gap between the support layer 4 and the binding area 32.

It should be noted that B is the width of the gap between the support layer 4 and the binding area 32 in the first direction. Therefore, the values in the above formula are all dimensions in the first direction. For example, the width of the first back film layer 9 is the width of the first back film layer 9 in the first direction, the fitting tolerance of the support layer 4 is also the fitting tolerance of the support layer 4 in the first direction, and the dimensional tolerance of the support structure 8 is also the dimensional tolerance of the support structure 8 in the first direction.

In exemplary embodiments, in the first direction, the side edge of the support layer 4 near the bending part 22 is flush with the bending start point, that is, in the first direction, the orthogonal projection of the support layer 4 on the support structure 8 away from the side edge of the first back layer 9 overlaps with the orthogonal projection of the bending start point of the bending part 22 on the support structure 8, the first direction is from the bending start point to the binding part 23, and the first direction is parallel to the display area 31.

In exemplary embodiments, in the first direction, the width of the support layer 4 is greater than or equal to 1.1 mm, the first direction is the direction from the bending start point to the binding part 23, and the first direction is parallel to the display area 31.

Referring to FIG. 4, in the first direction, the width of the support layer 4 is A=C−B, where C is the distance between the bending start point of the bending part 22 and the side of the binding area 32 away from the bending area 33 in the first direction, and the value is a preset value, which is a known numerical value. B is the width of the gap between the support layer 4 and the binding area 32 in the first direction. In one embodiment, the value of B is 1.1 mm, the value of C is 2.2±0.35 mm, thus the value of A is 1.1±0.35 mm, but is not limited thereto.

In exemplary embodiments, the bending part 22 includes an arc-shaped part 201, and a first part 202 and a second part 203 located on opposite sides of the arc-shaped part 201. The first part 202 is provided near the support structure 8, and a support adhesive layer 30 is provided between the first part 202 and the second part 203. The side edge of the support adhesive layer 30 facing the arc-shaped part 201 is flush with the starting point of the bending part 22, and the side edge of support adhesive layer 30 facing the arc-shaped part 201 is flush with the bending end point of the bending part 22. That is, the orthogonal projection of the line connecting the bending start point and the bending end point on the support structure 8 overlaps with the orthogonal projection of the side edge of the support adhesive layer 30 facing the arc-shaped part 201 on the support structure 8.

The support adhesive layer 30 is provided to ensure the bending morphology of the bending part 22.

In exemplary embodiments, the orthographic projection of the support adhesive layer 30 on the display area 31 overlaps at least partially with the orthographic projection of the support layer 4 on the display area 31.

In an embodiment, the orthographic projection of the support adhesive layer 30 on the display area 31 completely overlaps with the orthographic projection of the support layer 4 on the display area 31, so as to ensure the flatness of the first part 202 and reduce the pulling stress on the binding area 32.

In an embodiment, the orthographic projection of the support layer 4 on the display area 31 is located in the orthographic projection of the support adhesive layer 30 on the display area 31, the side of the support layer 4 facing the arc-shaped part 201 is flush with the side of the support adhesive layer 30 facing the arc-shaped part 201, the side of the support adhesive layer 30 away from the arc-shaped part 201 is exposed to the side of the support layer 4 away from the arc-shaped part 201, that is, the distance between the support adhesive layer 30 and the binding area 32 is less than the distance between the support layer 4 and the binding area 32.

Illustratively, in the first direction, the width of the support adhesive layer 30 is 0.4±0.1 mm, but is not limited thereto.

In exemplary embodiments, a protective adhesive layer 7 is provided between the side of the binding area 32 near the support layer 4 and the flexible printed circuit board 2.

In exemplary embodiments, a driver IC is provided on the side of the binding area 32 away from the display area 31, a connection adhesive layer 34 is provided between the main body part 21 of the flexible printed circuit board 2 and the binding area 32, and the connection adhesive layer 34 is coated on the outside of the driver IC.

The connection adhesive layer 34 functions as fixing the main body part 21 of the flexible printed circuit board 2 and protecting the driver IC.

In exemplary embodiments, in the second direction, the distance between the driver IC and the main body part 21 is greater than 0.2 mm, and the second direction is parallel to the light exiting direction of the display substrate 3.

There is a gap between the driver IC and the main body part 21 to avoid damage to the driver IC.

In the first direction, the length of the connection adhesive layer 34 is 7.2±0.15 mm to ensure stability of connection of the main body part 21, but is not limited thereto.

An embodiment of the present disclosure also provides a display device, including the above-mentioned display panel.

It is understood that the above embodiments are only exemplary embodiments for illustrating the principles of the present disclosure, but the present disclosure is not limited thereto. For those of ordinary skill in the art, various changes and improvements may be made without departing from the spirit and essence of the present disclosure, and these changes and improvements are also regarded as the scope of protection of the present disclosure.

What is claimed is:

1. A display panel, comprising: a display substrate and a flexible printed circuit board; wherein the display substrate comprises a display area, a binding area, and a bending area located between the display area and the binding area, the bending area is bent so that the binding area is located on a backlight side of the display area, and a support structure is provided between the displaying area and the binding area when the bending area is in a bending state;

the flexible printed circuit board comprises a main body part, a binding part for binding connection with the binding area, and a bending part located between the main body part and the binding part, wherein when the bending part is in a bending state, the bending part bends so that the main body part is bent to a side of the binding area away from the display area; wherein the bending part comprises a first part located between a bending start point and the binding part, and a support layer is provided between the first part and the support structure.

2. The display panel according to claim 1, wherein a first surface of the support layer away from the display area is flush with a second surface of the binding area away from the display area.

3. The display panel according to claim 1, wherein a first back film layer is provided between the binding area and the support structure, the first back film layer is connected to the support structure through an adhesive layer, and the support layer is provided on a same layer as the adhesive layer.

4. The display panel according to claim 3, wherein the support layer and the adhesive layer are integrative structure, or the support layer and the adhesive layer are separated structure.

5. The display panel according to claim 1, wherein a first back film layer is provided between the binding area and the support structure, the first back film layer is connected to the support structure through an adhesive layer, and the support layer covers a side of the adhesive layer away from the support structure.

6. The display panel according to claim 1, wherein a gap is provided between the support layer and the binding area in a first direction, the first direction is a direction from the bending start point to the binding area, and the first direction is parallel to the display area.

7. The display panel according to claim 6, wherein the gap is greater than or equal to 1.1 mm.

8. The display panel according to claim 1, wherein a side edge of the support layer near the bending part is flush with the bending start point in a first direction, the first direction is a direction from the bending start point to the binding part, and the first direction is parallel to the display area.

9. The display panel according to claim 1, wherein a width of the support layer is greater than or equal to 1.1 mm in a first direction, the first direction is a direction from the bending start point to the binding area, and the first direction is parallel to the display area.

10. The display panel according to claim 1, wherein the bending part comprises an arc-shaped part, the first part and a second part which are located on opposite sides of the arc-shaped part, a support adhesive layer is provided between the first part and the second part, a side edge of the support adhesive layer facing the arc-shaped part is flush with the bending start point of the bending part, and the side edge of the support adhesive layer facing the arc-shaped part is flush with a bending end point of the bending part.

11. The display panel according to claim 10, wherein an orthographic projection of the support adhesive layer on the display area overlaps at least partially with an orthographic projection of the support layer on the display area.

12. The display panel according to claim 1, wherein a protective adhesive layer is provided between the side of the binding area near the support layer and the flexible printed circuit board.

13. The display panel according to claim 1, wherein a driver IC is provided at the side of the binding area away from the display area, and a connection adhesive layer is provided between the main body part of the flexible printed circuit board and the binding area, and the connection adhesive layer is coated on outside of the driver IC.

14. The display panel according to claim 13, wherein a distance between the driver IC and the main body part is greater than 0.2 mm in a second direction, and the second direction is parallel to a light exiting direction of the display substrate.

15. A display device, comprising the display panel according to claim 1.

* * * * *